United States Patent [19]

Hagiwara et al.

[11] 4,064,524
[45] Dec. 20, 1977

[54] TWO-PHASE CHARGE TRANSFER DEVICE IMAGE SENSOR

[75] Inventors: Yoshiaki Hagiwara, Yokohama; Hiroshi Yamazaki, Ebina, both of Japan

[73] Assignee: Sony Corporation, Tokyo, Japan

[21] Appl. No.: 703,792

[22] Filed: July 9, 1976

[30] Foreign Application Priority Data

July 31, 1975 Japan .................................. 50-93746

[51] Int. Cl.² ...................... H01L 29/78; H01L 27/14; H01L 31/00; H01J 39/12
[52] U.S. Cl. ........................................ 357/24; 357/30; 250/211 J; 307/221 D
[58] Field of Search .................. 357/24, 30; 250/211 J

[56] References Cited

U.S. PATENT DOCUMENTS

| | | | |
|---|---|---|---|
| 3,816,769 | 6/1974 | Crowle | 357/24 |
| 3,826,926 | 7/1974 | White et al. | 357/24 |
| 3,856,989 | 12/1974 | Weimer | 357/24 |
| 3,883,437 | 5/1975 | Nummedal et al. | 357/24 |
| 3,896,474 | 7/1975 | Amelio et al. | 357/24 |
| 3,898,685 | 8/1975 | Engeler et al. | 357/24 |
| 3,971,003 | 7/1976 | Kosonocky | 357/24 |
| 3,983,573 | 9/1976 | Ishihara | 357/24 |
| 3,995,302 | 11/1976 | Amelio | 357/24 |
| 4,012,587 | 3/1977 | Ochi et al. | 357/30 |

OTHER PUBLICATIONS

Sequin, *Charge Transfer Devices*, Academic Press, N.Y. (7/75) pp. 60, 61, 163, 164.
Walsh et al., "A New Charge-Coupled Area Imaging Device", Suppl. of Proc. CCD Applications Conf., San Diego (9/73).

*Primary Examiner*—William D. Larkins
*Assistant Examiner*—Gene M. Munson
*Attorney, Agent, or Firm*—Hill, Gross, Simpson, Van Santen, Steadman, Chiara & Simpson

[57] ABSTRACT

A charge coupled device capable of operating with two phase clock pulses wherein asymmetrical potential wells are established by the use of channel stoppers which are formed on opposite edges of the charge coupled device and which have restricted portions through which the charges can flow from one storage area to the other.

The invention also comprises an information storage device including an array of photosensors with certain photosensors coupled to a particular charge transfer device according to the invention wherein channel stoppers with restricted passages are formed so as to provide asymmetrical charge transfer between the photosensors and various elements of the charge transfer device.

7 Claims, 14 Drawing Figures

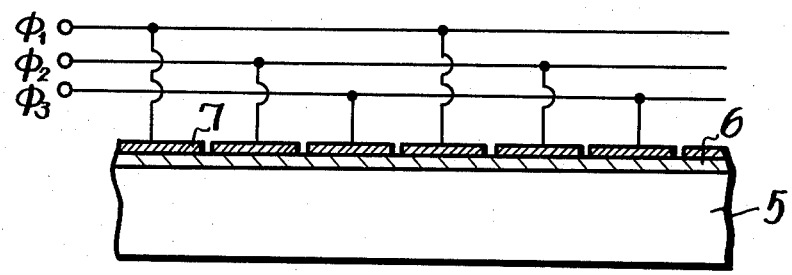
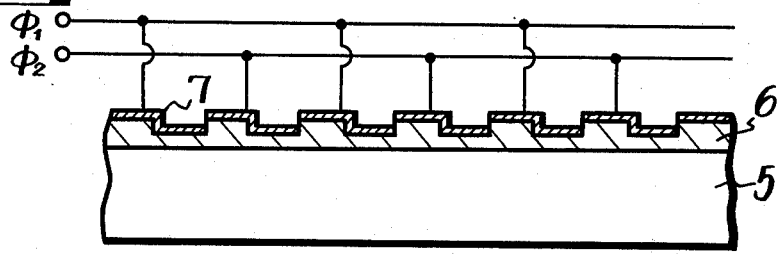
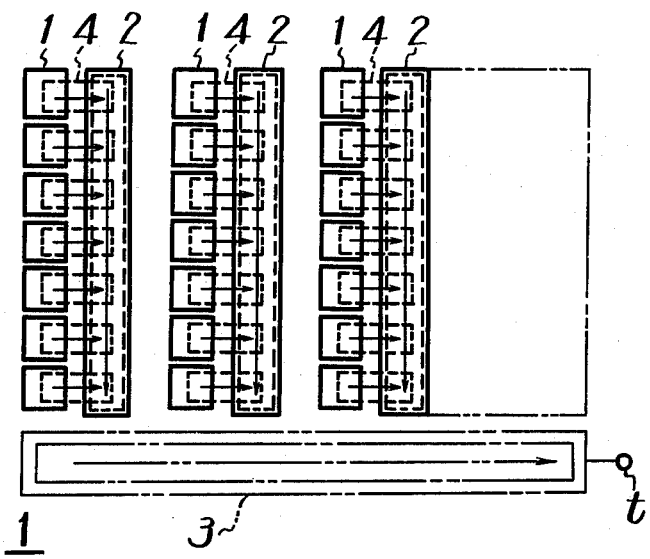
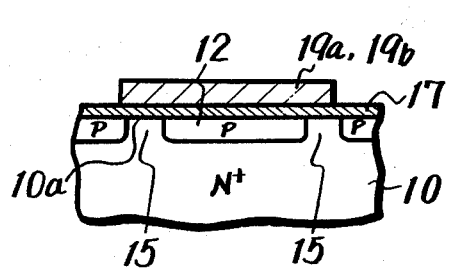
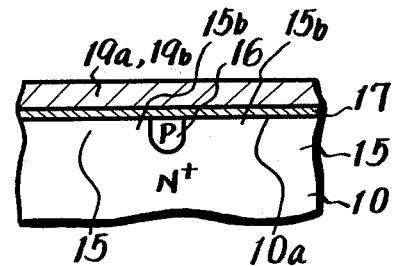

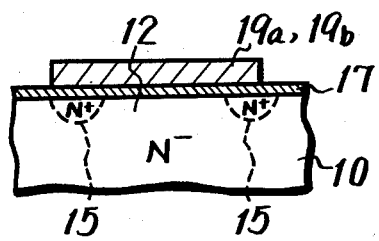
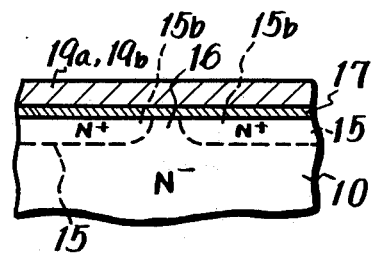
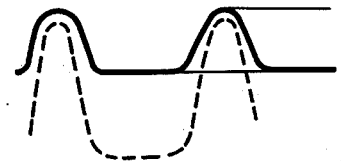
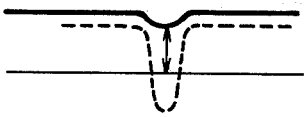
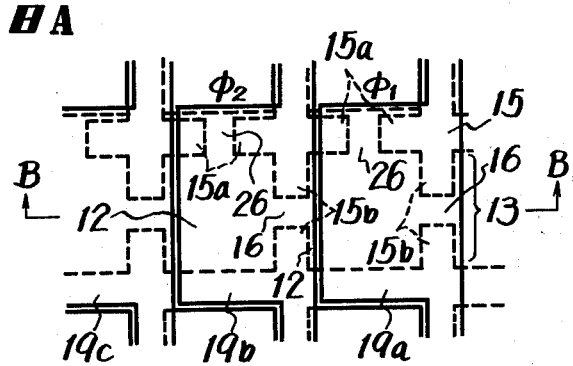
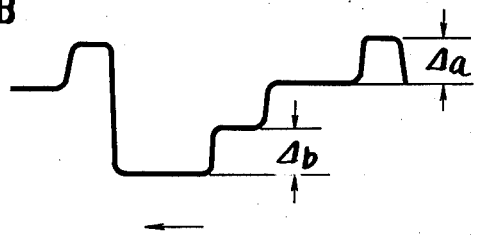

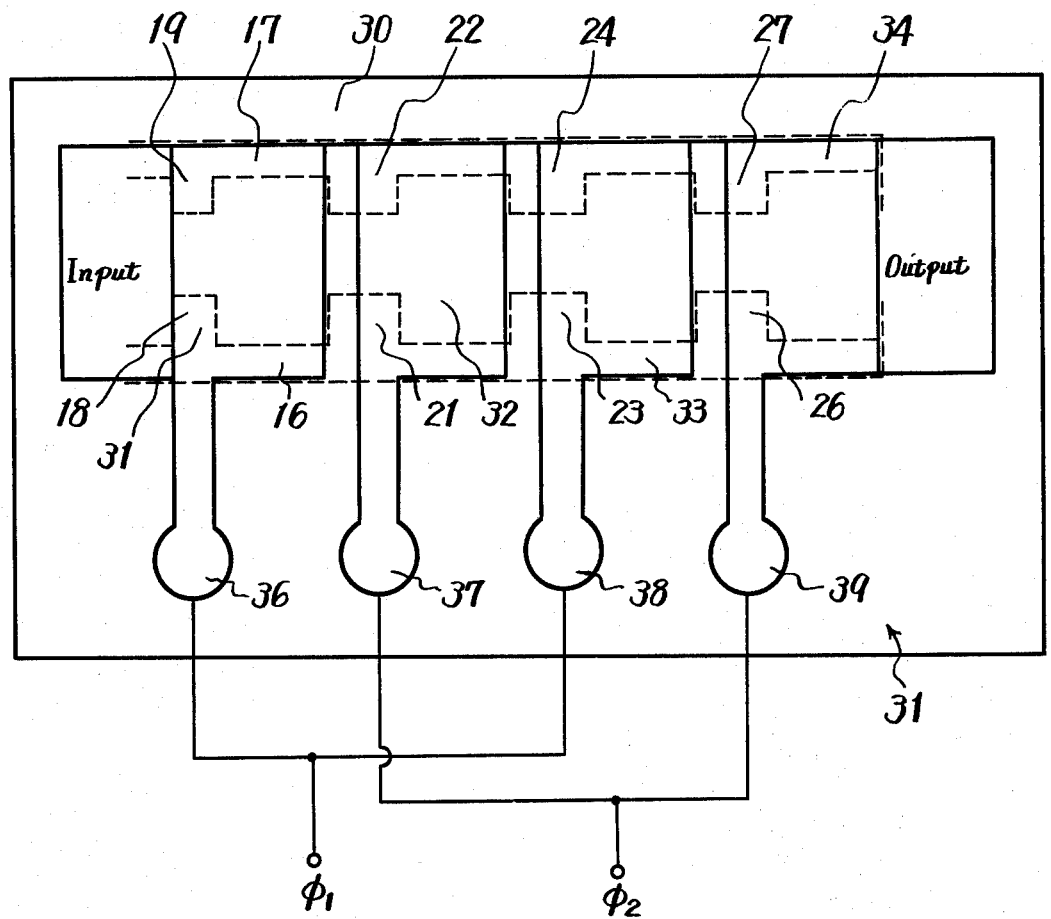

TWO-PHASE CHARGE TRANSFER DEVICE IMAGE SENSOR

BACKGROUND OF THE INVENTION

1. Field of the Invention

This invention relates in general to charge coupled devices and in particular to a novel charge coupled device and information storage device for storing and sequentially transferring electronic signals in representative of information.

2. Description of the Prior Art

Charge coupled devices have been well known for storing and transferring charges in a storage medium by the use of appropriate potentials applied upon an insulating layer overlying one surface of a medium. For example, the article entitled "Charge Coupled Imaging: State of the Art" which appeared in Solid State Devices 1973, pages 83 through 107 disclose a number of charge coupled devices as well as charge coupled image sensors.

Prior art charge coupled devices have used a plurality of aligned gates overlying an insulating layer on a substrate and wherein three phase clock signals are respectively applied to the gates.

Other charge coupled devices have utilized semiconductors having a layer of insulating material, as for example, silicon dioxide which varies in thickness and upon which aligned pairs of gates are arranged so as to operate with two phase clock signals.

It has also been known to provide asymmetrical doping under the gates so as to obtain asymmetrical charge distribution in the device. However, the use of three phase clock pulses, varying thickness of the insulating layer under the gates and asymmetrical doping results in complicated and expensive devices and methods particularly for obtaining the varying thickness of the insulating layer and the asymmetrical doping are very difficult to perform.

SUMMARY OF THE INVENTION

The present invention comprises a novel charge coupled device capable of operating with two phase clock signals and wherein channel stoppers are provided on opposite sides of the gates in the semiconductor material with restricted openings between adjacent storage areas under the gates so as to provide asymmetrical charge distribution in the charge transfer device.

In a specific application as an image sensor light sensing elements are provided adjacent storage elements in charge transfer devices with channel stoppers arranged so as to prevent charges from passing from a light sensor element to an adjacent light sensor element but which allows charges to flow from a particular light sensor element to its associated storage element and wherein said channel stoppers further are formed so as to provide restricted areas between adjacent storage areas to thus provide asymmetrical charge distribution and charge transfer in a unilateral direction through the storage device upon the application of clock signals.

A main object of the invention is to provide a two phase clock type charge transfer device which is free from the drawbacks of the two phase and three phase clock type devices of the prior art.

Another object of this invention is to provide an interline transfer system for a solid state area imaging device using a novel two phase clock type charge transfer device system.

In the invention a channel stopper region formed in a solid state area imaging device is used to form an asymmetrical potential well. Also, in this invention, a potential well can be easily formed without changing the thickness of the insulated oxide film over the substrate and the desired asymmetrical potential well can be formed by a channel stopper region having a predetermined shape.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure and in which:

BRIEF DESCRIPTION OF THE DRAWINGS

FIG. 1 illustrates a prior art three phase charge coupled device;

FIG. 2 illustrates a prior art two phase charge coupled device;

FIG. 3 is a top plan view of a solid state imaging device;

FIG. 6A is a cross-sectional view taken on lines $c$ or $c'$ from FIG. 4;

FIG. 6B illustrates the potentials in FIG. 6A;

FIG. 7A is a cross-sectional view taken on line $b$ or $b'$;

FIG. 7B illustrates the potentials in FIG. 7A;

FIG. 8A is a plan view illustrating a portion of FIG. 4;

FIG. 8B is a view illustrating the potential on a line taken on section line B—B of FIG. 8A;

FIG. 9 is a partial sectional view illustrating a modification of the invention;

FIG. 10 is a partial sectional view illustrating a modification of the invention; and FIG. 11 is a top plan view illustrating a charge transfer device according to the invention.

DETAILED DESCRIPTION OF THE PREFERRED EMBODIMENTS

Figure 4:
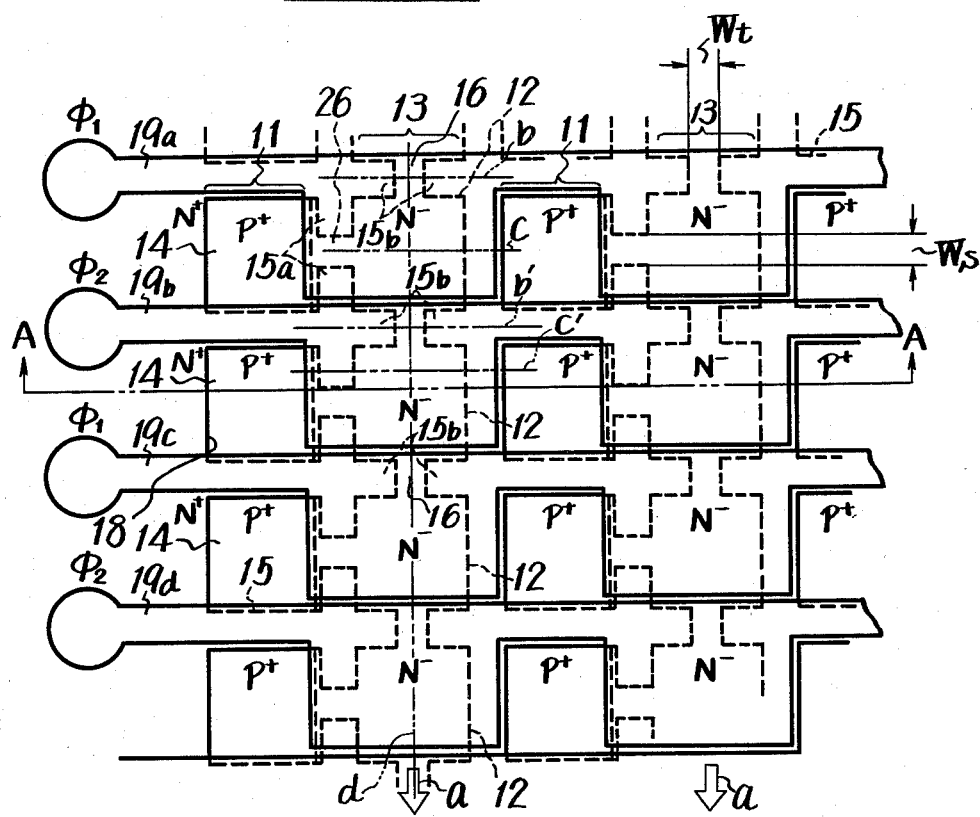
FIG. 4 is an enlarged plan view illustrating the solid state imaging area of the invention.

Prior art charge coupled devices have been either three phase or two phase clock types. FIG. 1 illustrates a prior art three phase clock type transfer device which comprises a substrate 5 made of, for example, silicon upon which a dielectric layer 6 made of silicon dioxide or some similar substance is deposited and a plurality of gate electrodes 7 are formed on the silicon dioxide layer 6 and are arranged in a charge transfer direction to form a transfer device. Every third gate electrode 7 is connected together to provide three sets of electrodes to which are applied three phase clock voltages $\phi_1$, $\phi_2$ and $\phi_3$ so as to form potential wells having different depths in the substrate under adjacent gate electrodes so that electrical charges being stored can be transferred unilaterally through the device. In such a three phase clock type charge transfer device, however, it is a drawback because the three phase drive is troublesome and the electrical conductive layers for supplying feed voltage to the gates will have a complicated pattern and in an image sensing device the number of picture elements per unit area cannot be increased when forming a solid state area imaging device.

FIG. 2 illustrates another example of charge coupled devices of the prior art utilizing two phase clock drive in which the elements similar to those in FIG. 1 are shown by the same reference numerals but wherein the dielectric layer 6 is made to have differing thicknesses under the gates 7 so that each gate has a first portion which is over a relatively thin layer of silicon dioxide and second portions which are over relatively thick portions of silicon dioxide. Such structures allow two phase clock drive which can be applied to alternate electrodes to transfer charge in a unilateral direction because potential wells which are asymmetrical relative to the charge transfer direction are formed in the neighborhood of the substrate surface under each electrode 7 due to the varying thickness of the dielectric 6. With such an arrangement, when two phase clock voltages $\phi_1$ and $\phi_2$ are applied, electrical charges will be transferred in one direction. The two phase clock type charge transfer device described is suitable for use in interline transfer system solid state imaging devices. Conventional two phase clock type CTD in which the thickness of the dielectric under each electric is made different at the front and rear portions relative to the charge transfer direction are very difficult to fabricate. Also, other prior art devices wherein the impurity concentration of the substrate surface under each electrode is made to vary between the front and rear edges are known, however, such devices are also very difficult to construct. Furthermore, the miniaturization of such devices is very difficlt due to the varying thicknesses of the dielectric 6 and/or the variation in the doping concentration.

FIG. 3 illustrates a solid state area imaging device using CTD, for example, using interline transfer system wherein there are disposed in a semiconductor substrate a plurality of island-like light sensing elements 1 which serve as the picture elements and are arranged as shown in FIG. 3. A vertical shift register having CTD construction is disposed at one side of each column of the light sensing elements 1 and a common horizontal shift register 3 also having CTD construction is provided at one end of each of the shift registers 2 so as to receive their outputs. The vertical shift registers 2 have transfer portions corresponding to the respective light sensing elements 1 and signal charges corresponding to the amount of light impinging upon each of the elements 1 are transferred to corresponding transfer portions of the vertical shift registers 2 by a charge transfer device construction illustrated in dotted line by 4. The transfer charges are shifted to the horizontal shift register 3 by the vertical shift registers 2 and the signal is successively derived from an output terminal $t$ of the horizontal shift register 3. These light sensing elements 1, the shift registers 2 and 3 are formed on a common semiconductor substrate and the portions between adjacent sensing elements 1 and the portions between the light sensing elements and the shift registers which are to be separated from each other are formed with channel stopper regions which are heavily doped with impurities so that they are isolated electrically from each other. The prior art solid state area imaging devices utilize CTD construction as discussed in the prior art above and have the same defects as such devices.

Figure 5:
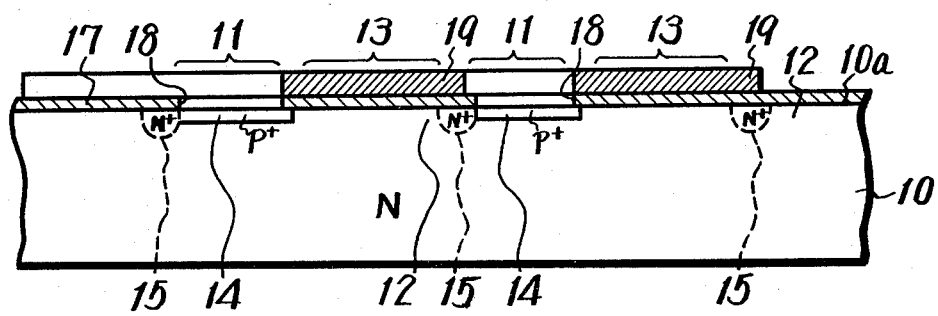
FIG. 5 is a cross-sectional view taken on line A—A of FIG. 4.

FIGS. 4 and 5 illustrate one example of an interline transfer system utilizing a solid state area imaging device according to the invention. A silicon substrate 10 of one conductivity type, for example N-type which has an impurity concentration of about $10^{15}$ atoms/cm$^3$ has provided on its main surface 10$a$ a plurality of light sensing elements 11 arranged in rows and columns so as to provide a light sensing matrix. A plurality of vertical shift registers 13 are each respectively associated with a column of light sensing elements and are provided with transfer regions 12 each of which corresponds to a light sensing element on one side thereof as shown.

Each light sensing element 11 is formed of a region 14 having a conductivity type different from that of the substrate 10 and might, for example, be P-type and have an impurity concentration of about $10^{17}$ to $10^{18}$ atoms/cm$^3$. The regions 14 can be formed by the same diffusion process during which the source and drain regions of an output MOS transistor (not shown) is formed and which is provided at the output for example of the horizontal shift register of the solid state imaging device.

In the substrate 10 are also provided channel stopper regions 15 which may contain N-type impurity concentration in the order of $10^{18}$ atoms/cm$^3$ which concentration is sufficiently higher than that of the substrate and which can be provided from the surface 10$a$ by ion injection methods, selective diffusion methods or similar processes. The channel stopper regions 15 are formed into a pattern such that they surround the peripheries of the respective light sensing elements and shift registers 13 except for portions between each light sensing element and its associated transfer region 12 of the shift register 13 as well as between adjacent transfer regions 12 of each shift register 13. In the example illustrated in FIG. 4 for example projecting portions 15$a$ of the channel stopper region 15 project toward a corresponding projecting portion 15$a$ between each light sensing element and its associated transfer region 12 so that the light sensng element 11 will not lose its electrical charge by leakage. In the example illustrated in FIG. 4, it is to be noted that the portions 15$a$ extend toward each other from opposite sides of the light sensing element 11 but it is to be realized that a single projecting portion 15$a$ can extend substantially toward the other side of the channel stopper and only a single projection need be used.

Additionally, second projecting portions 15$b$ are provided which extend from each channel stopper region 15 and project between adjacent transfer regions 12 in each shift register 13 to form therebetween areas of reduced cross-section 16. In the example illustrated in FIG. 4, the portions 15$b$ are formed at both sides of the transfer region and are arranged in the direction of each shift register 13 to form the reduced area portion 16 between opposite projection parts 15$b$, respectively. However, it is to be realized that various patterns can be provided so as to form the projection portions 15$b$ at one side thereof of each of the regions 12, for example.

As shown in FIG. 5, a dielectric layer such as silicon dioxide 17 is formed on the surface 10$a$ of the substrate 10 and windows 18 can be formed through the dielectric layer 17 and the light sensing element 11 can be formed so as to contact the P-type region 14. A plurality of transfer electrodes 19 (19$a$, 19$b$, 19$c$ . . . ) are deposited over the dielectric layer 17 and over the transfer regions 12 of the respective shift registers 13 on each row. Each of the electrodes 19$a$, 19$b$, 19$c$ . . . is deposited so as to extend over each transfer region aligned in a single horizontal row as shown in FIG. 4 and covers the transfer regions 12 and the regions of reduced areas 16 of the transfer region 12 located at its front edge with respect to the charge transfer direction "$a$". The electrodes 19 do not cover the windows 18 of the light sensing elements 11.

With the above described construction, when light impinges upon the light sensing element 11 (the P-type region 14) photoelectrons are generated depending on the amount of light and the electrons will escape into the channel stopper region 15 or substrate 10 so that a positive hole will be stored in the region 14. However, when electrical charges (positive holes) stored therein exceed a predetermined amount, the excess charges will escape into the region of the substrate 10. On the other hand, the electrical charges (positive holes) stored in the regions 14 will be transferred to the respective transfer regions 12 of each shift registers 13 which are formed corresponding to and adjacent to the light sensing elements 11. In other words, when the electrode 19 has applied thereto a predetermined transfer voltage, for example, $-15$ volts, the transfer region 12 will have a potential well which is deeper than that of the region 14 of the light sensing element and the electrical charges (positive holes) stored in the region 14 will be transferred to the transfer region 12.

The alternate electrodes 19a, 19c... and 19b and 19d ... will be respectively combined to form two sets of electrodes to which are then applied two phase clock voltages $\phi_1$ and $\phi_2$. The voltage of the clock pulses $\phi_1$ and $\phi_2$ will be selected to be lower than the above mentioned transfer voltage of $-15$ volts which is transferred from the light sensing element 11 to the transfer region 12 and may be for example, $-10$ volts. FIGS. 6A and 7A are cross-sectional views respectively taken on chain lines c or c' and b or b' in FIG. 4. Thus, FIG. 6A is a cross-sectional view through a wide portion of the transfer region 12 and FIG. 7A is a cross-sectional view through the restricted portion 16. FIGS. 6B and 7B are views showing the surface potentials at the respective sections during a condition when the electrodes 19b, 19d... have applied thereto a clock voltage pulse $\phi_2$. In FIGS. 6B and 7B full lines illustrate the potentials in the region 12 and the restricted portion 16 respectively under the electrode 19a and the broken lines illustrated the potentials in the region 12 and restricted portion 16 respectively under the electrode 19b to which is applied the clock voltage pulse $\phi_2$. It will be apparent from these Figures that where the distance between the channel stoppers 15 is large will have a wider potential well than the restricted portion or contracted portion 16 form between adjacent transfer regions 12 between each of the shift registers 13 which will have a shallow potential well due to the influence of the potential of the channel stopper region 15. Even at the restricted or contracted portion 16, however, the potential well depths will differ as the clock voltage is applied are not applied as is apparent from the comparison between the full line and broken lines in FIG. 7B. Thus, the surface potential distribution of the regions 12 along their charge transfer direction will be changed at the front and rear sides in the transfer direction of the region 12 and will become asymmetrical.

FIG. 8A is a partial plan view of the shift register 13 and wherein the orientation is rotated 90° relative to FIG. 4. FIG. 8B is a view illustrating the surface potential on the section line B—B which corresponds to the chain line d in FIG. 4. In this example, the set of electrodes 19b, 19d has applied thereto the clock voltage pulse $\phi_2$. It is obvious that the potential at the substrate surface under the electrodes 19b, 19d... to which the clock voltage is applied is lower than that under the electrodes 19a, 19c... but the surface potentials of the restricted or contracted portion 16 under the respective electrodes 19 are higher by $\Delta a$ and $\Delta b$ than those of the regions 12 under the corresponding electrodes 19. Therefore, each region 12 under the electrodes 19a, 19c ... will be provided with a potential barrier having a height of $\Delta a$ at its front edge with respect to the charge transfer direction and hence such an asymmetrical potential well will cause electrical charges to be transferred in a single direction that is, from each transfer region 12 under the electrode 19a toward the transfer region 12 under the electrode 19b.

As has been described above, according to the invention the asymmetrical potential well relative to the charge transfer direction is formed by the projecting portions 15b of the channel stopper region 15. Therefore, it is not necessary to vary the thickness of the dielectric layer in a step wise manner under each electrode or to change the concentration of the substrate surface as is done with prior art devices such as illustrated in FIG. 2. In other words, the two phase clock CTD of the present invention can be constructed in a simple manner without increasing the number of fabrication process steps over those of the prior art.

With the above construction, the transfer between adjacent transfer regions 12 in the shift register 13 can be accomplished with the clock voltage pulses $\phi_1$ and $\phi_2$ which are smaller than the voltage for shifting electrical charges from the light sensing element 11 to the corresponding transfer region 12.

If the width of a restricted or contracted portion 26 formed by the projecting areas 15a of the channel stopper 15 which are projected toward the light sensing element 11 and the corresponding region 12 is taken as $W_S$ and the width of the contracted part 16 is taken as $W_t$, the relationship therebetween can be suitably selected such that $W_s$ is exactly equal to $5\mu m$ and $W_t$ is exactly equal to $6\mu m$. With the above mentioned relationship while the transfer is being carried out in the shift register 13 the electrical charges will be prevented from flowing from the light sensing element 11 into the corresponding transfer region 12 of the shift register 13 or alternatively from the region 12 into the region 14 of the light sensing element 11. This is because of the voltages mentioned above of $-10$ volts and $-15$ volts are used as the transfer voltages.

When the light sensing element 11 is composed of a region 14 of P-type which is different from the conductivity type of the substrate region as mentioned above, electrical charges which are in excess and are stored therein will flow into the substrate so that an overflow drain is not necessary to be specifically provided and thus a space saving results.

In the above described embodiments, the invention is applied to a vertical shift register of the interline transfer system solid state area imaging device. However, the invention can be applied to the horizontal shift register (output shift register) and also to any other type of solid state area imaging device or other CTD.

Furthermore, the invention has been described primarily in a case where the invention is applied to a surface CTD but it can also be applied to a buried type CTD. Such an example is illustrated in FIGS. 9 and 10 wherein a semiconductor substrate 10 of one conductivity type for example, a N-type silicon substrate can be selectively formed with a region of other conductivity type or P-type facing its one surface 10a such that its transfer region 12 and a channel such as a reduced or contracted portion 16 between adjacent regions 12 should be formed and the N-type region of the substrate 10 itself can serve as a channel stopper region 15. In FIGS. 9 and 10 the elements corresponding to those shown in FIGS. 6A and 7A are indicated by the same reference numerals and their description will not be repeated.

FIG. 11 illustrates the principles of the invention by using channel stoppers having restricted portions in a charge coupled device.

A substrate 31 has formed therein channel stopper regions 16 and 17 which extend along opposite sides thereof and extending portions 18 and 19, 21 and 22, 23 and 24, 26 and 27, and 28 and 29 extend, respectively, from the channel stoppers 16 and 17 toward each other as shown. A dielectric layer 30 is formed over the surface of the substrate and channel stopper regions and electrodes 31 through 34 are formed over the dielectric layer 30 and are provided with input leads 36 through 39 as shown. Alternate leads 36 through 38 receive clock voltage pulses $\phi_1$ and the remaining alternate electrodes 37 and 39 receive clock voltage pulses $\phi_2$. The device in FIG. 11 receives charges at one end which are transferred through the device to the other end due to the asymmetrical potential wells caused by the restricted portions 19, 22, 24, and 27 and 18, 21, 23, and 26 for the same reason as described with respect to the embodiments illustrated above. Thus, as shown in FIG. 11 a novel charge coupled device can be provided without varying the thickness of the dielectric layer and are varying the impurity concentration of the device.

It is seen that this invention comprises a new and novel charge transfer device and although it has been described with respect to preferred embodiments it is not to be so limited as changes and modifications may be made therein which are within the full intended scope as defined by the appended claims.

We claim as our invention:

1. A two phase charge transfer device comprising a semiconductor substrate, an insulation layer of uniform thickness formed on said substrate, a shift register having a plurality of cells formed in said substrate, an input to said shift register and an output to said shift register between which charges flow, a plurality of aligned electrodes formed over said cells on said insulation layer and means for applying two phase clock signals to said aligned electrodes to form potential wells in said cells and to shift said charges, each of said cells comprising a transfer region and a storage region, a transfer region of a cell being located between a storage region of said cell and said input, each of said cells formed of said transfer and storage regions of said substrate having a first impurity concentration of one conductivity type and channel stopper regions having a higher second impurity concentration of said one conductivity type with the regions of said substrate forming said storage regions being defined by regions of said first impurity concentration bordered in a direction transverse to the charge flow direction by channel stopper regions of said second impurity concentration, and said transfer regions being defined by regions of said first impurity concentration which are narrower in said transverse direction than said regions of first impurity concentration in said storage regions and said regions of said first impurity concentration in said transfer regions being bordered in said transverse direction by channel stopper regions of said second impurity concentration higher than said first impurity concentration to form asymmetrical potential wells in said cells, the surface potential in a storage region of a cell being deeper than that in a transfer region of said cell.

2. A two phase charge coupled image sensor comprising a semiconductor substrate, an insulation layer of uniform thickness formed on said substrate, a shift register having a plurality of cells formed in said substrate, a plurality of electrodes formed over said cells on said insulation layer and means for applying two phase clock signals to said electrodes to form potential wells in said cells and to shift charges, each of said cells comprising first and second transfer regions and a storage region, a plurality of light sensor regions with one of said light sensor regions associated with each cell of said shift register and each light sensor connected to supply charges to a second transfer region of each cell, said first transfer regions arranged between said cells to move charges in a first direction through said shift register and said second transfer regions adapted to move charges from said light sensors into said storage regions in a direction normal to said first direction, each of said cells formed of said transfer and storage regions having a first impurity concentration of one conductivity type and channel stopper regions having a higher second impurity concentration of said one conductivity type, said storage regions defined by regions of first impurity concentration bordered in both the first and normal directions by channel stopper regions, said first transfer regions being defined by regions of said first impurity concentration which are narrower in said normal direction transverse to said shift register charge flow direction than said storage regions, said first transfer regions being bordered in said normal direction by channel stopper regions, said second transfer regions being defined by regions of said first impurity concentration which are narrower in said first direction transverse to said charge flow direction between said light sensors and said storage regions than said storage regions, said second transfer regions being bordered in said first direction by channel stopper regions, asymmetric potential wells being formed in said cells, the surface potential in a storage region of a cell being deeper than that in a first transfer region of said cell and deeper than that in a second transfer region of said cell.

3. A two phase charge coupled image sensor according to claim 2, wherein said second transfer regions are narrower than said first transfer regions transverse to the charge flow directions.

4. A two phase charge coupled image sensor according to claim 2, wherein said means for shifting charges applies a voltage to said plurality of electrodes to shift charges from said light sensor regions to said storage regions which is higher than the voltage applied to said electrodes to shift charges from one storage region to an adjacent storage region.

5. A two phase charge coupled image sensor comprising a semiconductor substrate, an insulation layer of uniform thickness formed on said substrate, a plurality of light sensor regions formed on said substrate in a matrix to define rows and columns, a plurality of shift registers with one shift register mounted between columns of said light sensors and receiving charges from said light sensors, each of said shift registers having a plurality of cells formed in said substrate, each of said cells comprising first and second transfer regions and a storage region, each of said light sensors associated with one of said cells and connected to supply charges to said second transfer region of said cell, said first transfer regions of the cells of each shift register arranged between said cells to move charges in a first direction through said shift register and said second transfer regions adapted to move charges from said light sensors to said storage regions in a direction normal to said first direction, each of said cells formed of said transfer and storage regions having a first impurity concentration of one conductivity type and channel stopper regions having a higher second impurity concentration of said one conductivity type, said storage regions defined by regions of first impurity concentration bordered in both the first and normal directions by channel stopper regions, said first transfer regions being defined by regions of said first impurity concentration which are narrower in said nomral direction transverse to said shift register charge flow direction than said storage regions, said first transfer regions being bordered in said normal direction by channel stopper regions, said second transfer regions being defined by regions of said first impurity concentration which are narrower in said first direction transverse to said charge flow direction between said light sensors and said storage regions than said storage regions, said second transfer regions being bordered in said first direction by channel stopper regions, a first plurality of electrodes extending on said substrate in the row direction with each electrode overlying first and second transfer regions and a storage region of each shift register, a second plurality of electrodes extending on said substrate in the row direction in an alternating arrangement with said first plurality of electrodes with each electrode overlying first and second transfer regions and a storage region of each shift register, and means for applying two phase clock signals to said first and second plurality of electrodes so as to form asymmetrical potential wells in said cells, the surface potential in a storage region of a cell being deeper than that in a first transfer region of said cell and deeper than that in a second transfer region of said cell.

6. A two phase charge coupled image sensor according to claim 5 wherein said means for shifting charges applies a voltage to said first and second plurality of electrodes to shift charges from said light sensors to said storage regions which is greater than the voltage applied to said first and second plurality of electrodes to shift charges from one storage region to an adjacent storage region.

7. A two phase charge coupled image sensor according to claim 5 wherein said second transfer regions are narrower than said first transfer regions transverse to the charge flow directions.

* * * * *